United States Patent
Goto et al.

(10) Patent No.: US 9,571,055 B2
(45) Date of Patent: Feb. 14, 2017

(54) LEVEL ADJUSTMENT DEVICE AND METHOD

(71) Applicant: YAMAHA CORPORATION, Hamamatsu-shi, Shizuoka-ken (JP)

(72) Inventors: Mitsutaka Goto, Hamamatsu (JP); Kenji Suzuki, Hamamatsu (JP)

(73) Assignee: YAMAHA CORPORATION, Hamamatsu-shi (JP)

( * ) Notice: Subject to any disclaimer, the term of this patent is extended or adjusted under 35 U.S.C. 154(b) by 36 days.

(21) Appl. No.: 14/657,331

(22) Filed: Mar. 13, 2015

(65) Prior Publication Data

US 2015/0263690 A1   Sep. 17, 2015

(30) Foreign Application Priority Data

Mar. 14, 2014  (JP) ................. 2014-051426

(51) Int. Cl.
  *H04R 29/00*  (2006.01)
  *H03G 3/30*  (2006.01)
  *H03G 7/00*  (2006.01)

(52) U.S. Cl.
  CPC ............ *H03G 3/301* (2013.01); *H03G 3/3089* (2013.01); *H03G 7/002* (2013.01); *H03G 7/007* (2013.01);
(Continued)

(58) Field of Classification Search
  CPC ........ H03G 7/007; H03G 3/301; H03G 7/002; H03G 3/3089; H04S 2400/01; H04R 2430/01
  See application file for complete search history.

(56) References Cited

U.S. PATENT DOCUMENTS

2004/0240685 A1* 12/2004 Sakakibara ............. H03G 3/10
                                                                381/104
2007/0076905 A1*  4/2007 Konagai ................ H04R 1/403
                                                                381/104
(Continued)

FOREIGN PATENT DOCUMENTS

| JP | 5236006 B2 | 7/2013 |
| WO | 2010028683 A1 | 3/2010 |
| WO | 2013075848 A1 | 5/2013 |

OTHER PUBLICATIONS

European Search Report issued in counterpart application No. EP15158754.0, dated Sep. 9, 2015.

*Primary Examiner* — Muhammad N Edun
(74) *Attorney, Agent, or Firm* — Rossi, Kimms & McDowell LLP (57) ABSTRACT

A level of an input signal is detected according to a first following rate, and a first level signal indicating the detected level is generated. A level of the input signal is detected according to a second following rate lower than the first following rate, and a second level signal indicating the detected level is generated. One of the first and second level signals is selected based on a relation (e.g., ratio) between the first and second level signals so that a gain is determined based on the selected one of the first and second level signals. The level of the first input signal is adjusted according to the determined gain. For example, if the level variation is dominant, the gain adjustment suitable for the level variation can be performed, whereas, if the stable level is dominant, the gain adjustment suitable for the stable level can be performed.

11 Claims, 5 Drawing Sheets

(52) U.S. Cl.
CPC ........ *H04R 2430/01* (2013.01); *H04S 2400/13* (2013.01)

(56) References Cited

U.S. PATENT DOCUMENTS

| | | | |
|---|---|---|---|
| 2010/0054497 A1* | 3/2010 | Bull | H03G 3/02 381/104 |
| 2011/0255712 A1 | 10/2011 | Urata | |

\* cited by examiner

LEVEL ADJUSTMENT DEVICE AND METHOD

BACKGROUND

The present invention relates to a level adjustment device and method capable of automatically adjusting a volume level of a sound signal such as a music sound signal to a proper volume level in such a case that a currently played music is changed to another one in background music, or the volume level is varied in a currently played music, for example.

In a case that a plurality of music pieces are played continuously via an audio system as background music or the like, because of a difference of volume levels between the music pieces played one after anther and/or a level variation in a currently-played music piece, it is desired to automatically adjust volume levels of musical sounds being played to proper volume levels for each music piece so that a listener can hear surely the musical sounds, and that the volume levels do not become louder. To automatically adjust the volume, there have been known a level adjustment device which controls an audio gain in response to a level of an input signal so as to suppress the level variation in the input signal and outputs the gain adjusted output signal. Such the level adjustment device comprises a level detection section to detect a level of an input signal. This level detection section is constructed to detect the level of the input signal following a level variation in the input signal, and a following rate therefor is decided according to a time constant which is variably set in the level detection section. If the following rate is set to a low rate by setting the time constant to a great value, the level detection cannot follow a level variation in a time period where the level of musical sounds varies at high rate, therefore the level of the musical sounds played in the time period will be too loud. On the other hand, if the following rate is set to a high rate by setting the time constant to a small value, because the level adjustment will follow rapidly the variation of the level of the musical sounds, a listener will perceive the variation of the gain level. Accordingly, there have been proposed a level adjustment device constructed to calculate a long-term gain corresponding to a low following rate and a short-term gain corresponding to a high following rate, and to adjust the level of signals based on the calculated long-term gain and short-term gain (see Japanese Patent No. 5236006 which corresponds to U.S. Patent Application Publication No. 2011/255712, for example).

From a standpoint of a listener, perceiving the gain variation during a playback of a music piece is undesirable because of disturbing music listening. That is, it is desirable to slow the following rate for the gain adjustment, basically. However, the conventional method which calculates both of the long-term gain and the short-term gain has a complicated construction of signal processing. Further, it is difficult to predict how the level of the signal varies after the gain adjustment.

SUMMARY OF THE INVENTION

In view of the foregoing prior art problems, it is an object of the present invention to provide an improved level adjustment device which achieves such a level adjustment as not to make a listener perceive a gain variation so much, and which can address even a signal having level variations of a high rate, and which has a simple construction easy to control, as well as an improved method therefor.

In order to accomplish the aforementioned object, the present invention provides an improved level adjustment device, which comprises: a first level detection section configured to detect a level of an input signal according to a first following rate to output a first level signal indicating the detected level; a second level detection section configured to detect a level of the input signal according to a second following rate which is lower than the first following rate to output a second level signal indicating the detected level; a control section configured to select one of the first level signal and the second level signal based on a relation between the first level signal and the second level signal and determine a gain for level adjustment based on the selected one of the first level signal and the second level signal; and an adjustment section configured to adjust the level of the first input signal according to the gain determined by the control section.

According to the present invention, because detection of the level of the input signal is conducted by use of two kinds of following rates (i.e., the first and second following rates) and determination of the gain for level adjustment is conducted based on the selected one of the detected first and second level signals, a construction of the device can be simplified. For example, if a change in level is dominant in the input signal, it is possible to perform the gain adjustment suitable for the change in level, on the other hand if a stability of level is dominant in the input signal, it is possible to perform the gain adjustment suitable for the stability of level. Hence, according to the present invention, it is possible to provide a level adjustment device which achieves such a level adjustment as not to make a listener perceive a gain variation so much, and which can address even a signal having level variations of a high rate, and which has a simple construction easy to control.

The present invention may be constructed and implemented not only as the device invention discussed above but also as a method invention. Also, the present invention may be arranged and implemented as a software program for execution by a processor, such as a computer or DSP, as well as a non-transitory computer-readable storage medium storing such a software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

Figure 1:
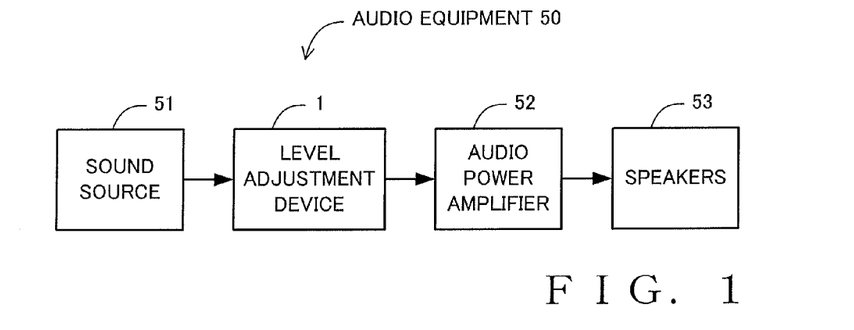
FIG. 1 is a block diagram showing an audio equipment including a level adjustment device according to an embodiment of the present invention.

FIG. 1 shows a construction of audio equipment 50 including a level adjustment device according to an embodiment of the present invention. Note that the level adjustment device according to an embodiment of the present invention can be a digital audio signal processing device which is embodied a level adjustment method according to an embodiment of the present invention, but also can be an analog audio signal processing device which is embodied the said method.

In FIG. 1, a sound source 51 is a supply source of an audio signal to be played on the audio equipment 50 and to be output from speakers 53, which can be a cable broadcast, a musical server terminal, a long time recorder, a mixer, or the like. The digital audio signal from the sound source 51 is input to a level adjustment device 1 according to the present invention, and in the level adjustment device 1, the level of the audio signal is adjusted automatically in accordance with the input level of the audio signal. The audio signal automatically adjusted the level by the level adjustment device 1 is converted to the analog audio signal and amplified to audibly output through the speakers 53. The level adjustment device 1 can be constructed not only as a stand-alone component by itself, but also as a part of other device or equipment. For example, the level adjustment device 1 may be incorporated in a body of the sound source 51 as a part of that, a body of an audio power amplifier 52 as a part of that, or a body of the speaker 53 as a part of that.

Figure 2:
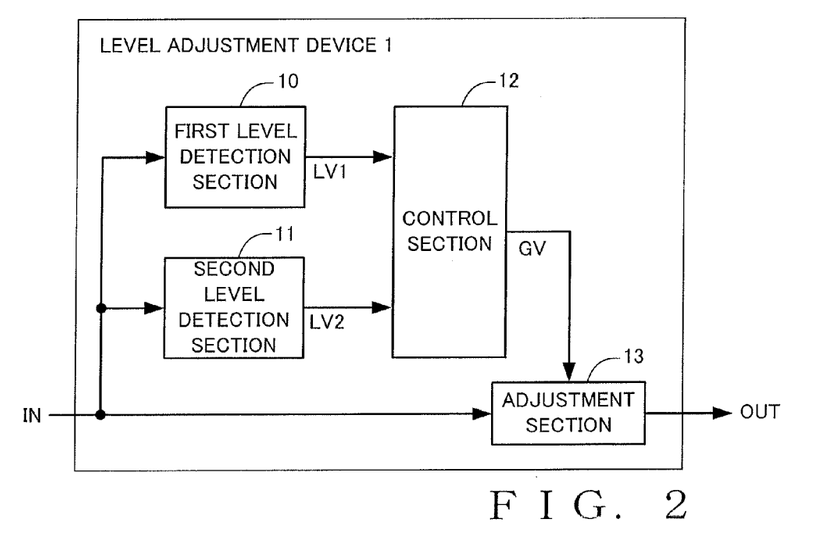
FIG. 2 is a block diagram showing a configuration of the level adjustment device according to a first embodiment of the present invention.

FIG. 2 is showing a construction of the level adjustment device 1 according to a first embodiment of the present invention. In the embodiment, "attack rate" and "release rate" are used as the "following rates" as mentioned below, and each of them is a "time constant" defining a speed or rate to follow a peak level of each wave cycle of the input signal.

In the level adjustment device 1 shown in FIG. 2, the audio signal from the sound source 51 is input via an input terminal to a first level detection section 10, a second level detection section 11, and an adjustment section 13. The first level detection section 10 detects the level of the input audio signal by a first following rate which is relatively high in comparison with a second following rate for the second level detection section 11, and outputs a first level signal LV1 indicating the detected level. In addition, the second level detection section 11 detects the level of the input audio signal by the second following rate which is relatively low in comparison with the first following rate for the first level detection section 10, and outputs a second level signal LV2 indicating the detected level.

In one embodiment, each of the first following rate and the second following rate has an attack rate and a release rate lower than the attack rate. For example, the attack rate for the first following rate may be determined selectively from a range of several milliseconds to several tens of milliseconds, and the release rate for the first following rate may be determined selectively from a range of several hundreds of milliseconds to several seconds. Also, the attack rate for the second following rate may be determined selectively from a range of several hundreds of milliseconds to several seconds, and the release rate for the second following rate may be determined selectively from a range of several seconds to several tens of seconds. In one embodiment, each level detection section 10 (or 11) detects the level of the input audio signal using the attack rate, when the current level (current sample value) of the input audio signal is greater than the level signal LV1 (or LV2) currently output by the level detection section 10 (or 11), whereas each level detection section 10 (or 11) detects the level of the input audio signal using the release rate, when the current level is less than the level signal LV1 (or LV2).

The first level signal LV1 and the second level signal LV2 are supplied to a control section 12. The control section 12 selects one of the first and second level signals LV1 and LV2 based on a ratio (level ratio of the first level signal to the second level signal, determines, based on a gain curve, a gain value GV corresponding to the selected level signal, and supplies the gain value GV to the adjustment section 13. When the ratio of the first level signal to the second level signal is equal to or more than a predetermined threshold value which is equal to or more than "1" (one), the first level signal LV1 of the high following rate (the first following rate) is selected, whereas, the second level signal LV2 of the low following rate (the second following rate) is selected if not so. Then, the adjustment section 13 amplifies the audio signal from the sound source 51 with the gain corresponding to the supplied gain value GV to equalize the level of the audio signal output from the level adjustment device 1. "Equalization" referred to herein means adjusting the level of the audio signal in such a manner that volumes of different long phrases included in an audio signal or volumes of different pieces of music are listened or felt by a listener similarly to each other. Unless an urgent case where the input level increases rapidly, the control section 12 is constructed to vary slowly the gain value GV, thus a shape of level variation (so-called envelope) from an attack to a release of an individual note included in the audio signal from the sound source 51 or a relation of sound intensity between successive notes are basically maintained. The adjustment section 13 can be constructed by an amplifier or an attenuator.

Figure 3A:
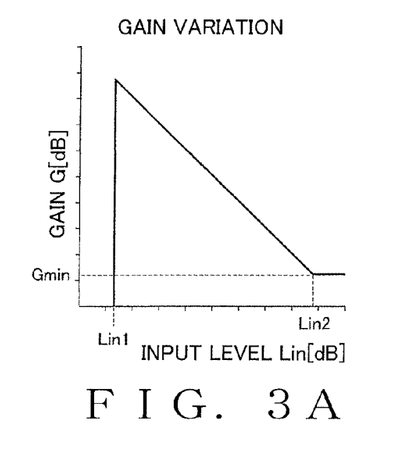
FIGS. 3A and 3B are graphs showing a gain characteristic and an input-output characteristic of the level adjustment device according to the first embodiment.
Figure 3B:
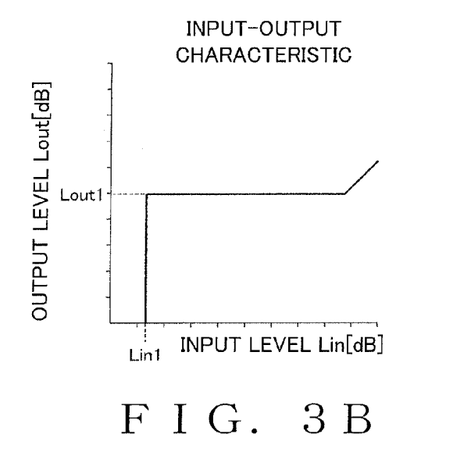

A variation characteristic of the gain shown in FIG. 3A is a "gain curve" which shows input and output on a decibel scale. The control section 12 determines a gain G (namely, gain value GV) responsive to an input level Lin (namely, the level signal LV1 or LV2) based on the gain curve. Thereby, an input-output characteristic of the level adjustment device 1 can be represented, on a decibel scale, as shown in FIG. 3B.

As shown in FIG. 3A, in a range of which the input level Lin is −∞ (dB) to a first predetermined level Lin1 (dB), the gain G is −∞ (dB). Therefore, the audio signal is muted, and the level adjustment device 1 outputs a silent signal. In a range of which the input level Lin is equal to or more than the first predetermined level Lin1 (dB), the gain G is decreased responsive to an increase of the input level Lin and is increased responsive to a decrease of the input level Lin, so that the increase and decrease of the input level Lin are canceled. Thus, the level adjustment device 1 outputs the signal having equalized-level characteristics. However, the gain G has a lower limit Gmin because of hardware circumstances and the like. In a range of which the input level Lin is more than a second predetermined level Lin2 (dB), it is required to decrease the gain G less than the lower limit Gmin for the cancellation, but the gain G can not be decreased less than the lower limit Gmin, thus the gain G is maintained the lower limit Gmin instead of being decreased less than the lower limit Gmin. In this range, the audio signal having the level increasing or decreasing in response to the input level Lin is output. Note that the upper limit of the input level Lin can be limited on a input side so that the upper limit of the input level Lin may not be greater than the second predetermined value Lin2, or a hard wear which can be take the more small lower limit Gmin can be adopted in order to set the second predetermined value Lin2 to more great value.

Figure 4:
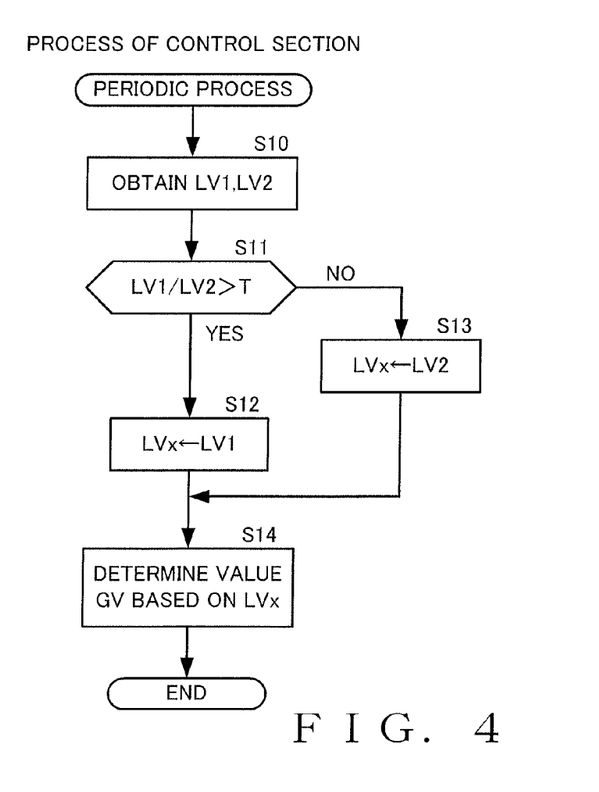
FIG. 4 is a flow chart of a process executed by a control section of the level adjustment device according to the first embodiment.

FIG. 4 shows a flow chart of a periodic process executing by the control section 12 of the level adjustment device 1. The periodic process shown in FIG. 4 is a process which executes repeatedly during an operation. The control section 12 executes the periodic process for each predetermined or variable time period. First, at step S10, the control section 12 obtains the first level signal LV1 from the first level detection section 10 and the second level signal LV2 from the second level detection section 11. The first level signal LV1 and the second level signal LV2 obtained by the control section 12 have values represented on a linear scale. At step S11, the control section 12 determines whether a value (level ratio) obtained by dividing the first level signal LV1 by the second level signal LV2 is greater than a threshold value T. Here, the threshold value T is a constant equal to or more than one. If the level ratio is greater than the threshold value T, the control section 12 makes an affirmative judgment at step S11, and then forwards the process to step S12. At step S12, the control section 12 stores the first level signal LV1 in a register LVx. Then At step S14, the control section 12 determines a gain value GV corresponding to the first level signal LV1 stored in a register LVx based on the gain curve of the linear scale having the same characteristic as the one shown in FIG. 3A, and ends the periodic process. On the other hand, if the level ratio is equal to or less than the threshold value T, the control section 12 makes a negative judgment at step S11, and then advances the processing to step S13. At step S13, the control section 12 stores the second level signal LV2 in a register LVx. Then, at step S14, the control section 12 determines a gain value GV corresponding to the second level signal LV2 stored in a register LVx based on the gain curve of the linear scale having the same characteristic as the one shown in FIG. 3A, and ends the periodic process. It is preferable to configure to supply the gain value GV to the adjustment section 13 after having equalized the gain value GV determined by the periodic process to convert into the gain value GV which smoothly changes temporally. The equalizing process may be performed by the adjustment section 13, but it is desirable that the control section 12 performs the equalizing process such as a low-pass filter processing or an interpolation and the like at step S14 of the periodic process. By the equalizing process, the gain value GV supplied from the control section 12 to the adjustment section 13 smoothly changes temporally even if the determination at step S11 has been switched. Then the adjustment section 13 amplifies the input audio signal by the gain corresponding to the gain value GV and outputs it. Accordingly, the level adjustment device 1 outputs the audio signal of which level is equalized.

Note that the gain curve used at step S14 can be composed by a gain table stored the gain values GV referred to in response to the level signal, or an arithmetic operation to calculate the gain values GV by applying the level signal. In addition, the inequality sign in the determination condition at step the S11 is not limited to ">" indicating "greater than", and may be "≥" indicating "equal to or greater than."

Because the periodic process described above is performed by the control section 12, in the level adjustment device 1 according to the first embodiment of the present invention, the case where the ratio of the first level signal LV1 to the second level signal LV2 is greater than the threshold value T is such a case where the level variation of the input audio signal is fast, in this case, the level of audio signal is controlled based on the first level signal LV1 following the level variation of the audio signal by the following rate which is relatively high. Therefore, it is possible to perform the level adjustment in response to a signal in which the level varies by a high rate. Further, the case where the ratio of the first level signal LV1 to the second level signal LV2 is less than the threshold value T is such a case where the level variation of the input audio signal is slow, in this case, the level of audio signal is controlled based on the second level signal LV2 following the level variation of the audio signal by the following rate which is relatively lower than the first level signal detected by the first detection section 10. Therefore, it is possible to perform the level adjustment without making a listener perceive the variation of the gain level. These level control can be embodied a simple construction easy to control, such as determining a gain using one gain curve at the control section 12 based on two levels detected at two level detection section 10 and 11. The selection condition for the first level signal LV1 can be adjusted properly by the value of the threshold value T which is equal to or more than 1. If the threshold value T is set to the value close to 1, because a chance to select LV1 increases, a fast attack in the audio signal can be reduced surely, but at the same time, it cause user to sensitively perceive the temporal gain variation. As the value of threshold value T is distant from 1, because a chance to select LV2 increases, it cause user to not sensitively perceive the temporal gain variation, but there may be a case where the fast attack in the audio signal is not completely reduced. Note that, in above description, the threshold value T is set to the value equal to or more than one, but also the value less than one can be applied as the threshold value T. However, if the threshold value T is set to the value less than 1, because an angular-shaped discontinuity occurs in the gain variation, it cause user to perceive the gain variation, thus it is better to avoid it.

At step S11 of the periodic process, the control section 12 performs the determination on the linear scale, but also the determination may be performed on a decibel scale. In this case, before performing step S11, the control section 12 converts the first level signal LV1 and the second level signal LV2 to signals on the decibel scale, and performs the determination with a mathematical expression for the determination (LV1−LV−2)>T', where T' is a positive threshold value on the decibel scale which is obtained by converting the threshold value T to the decibel scale, and also the inequality sign ">" in the expression may be replaced with "≥". In this way, similarly to the aforementioned periodic process, it is possible to determine whether the ratio (level ratio) of first level signal LV1 to the second level signal LV2 is be greater than the threshold value T. In addition, in this case, applying the gain curve to the level value at step S14 can be performed on the decibel scale in the same manner as a second embodiment mentioned hereinafter.

Figure 5:
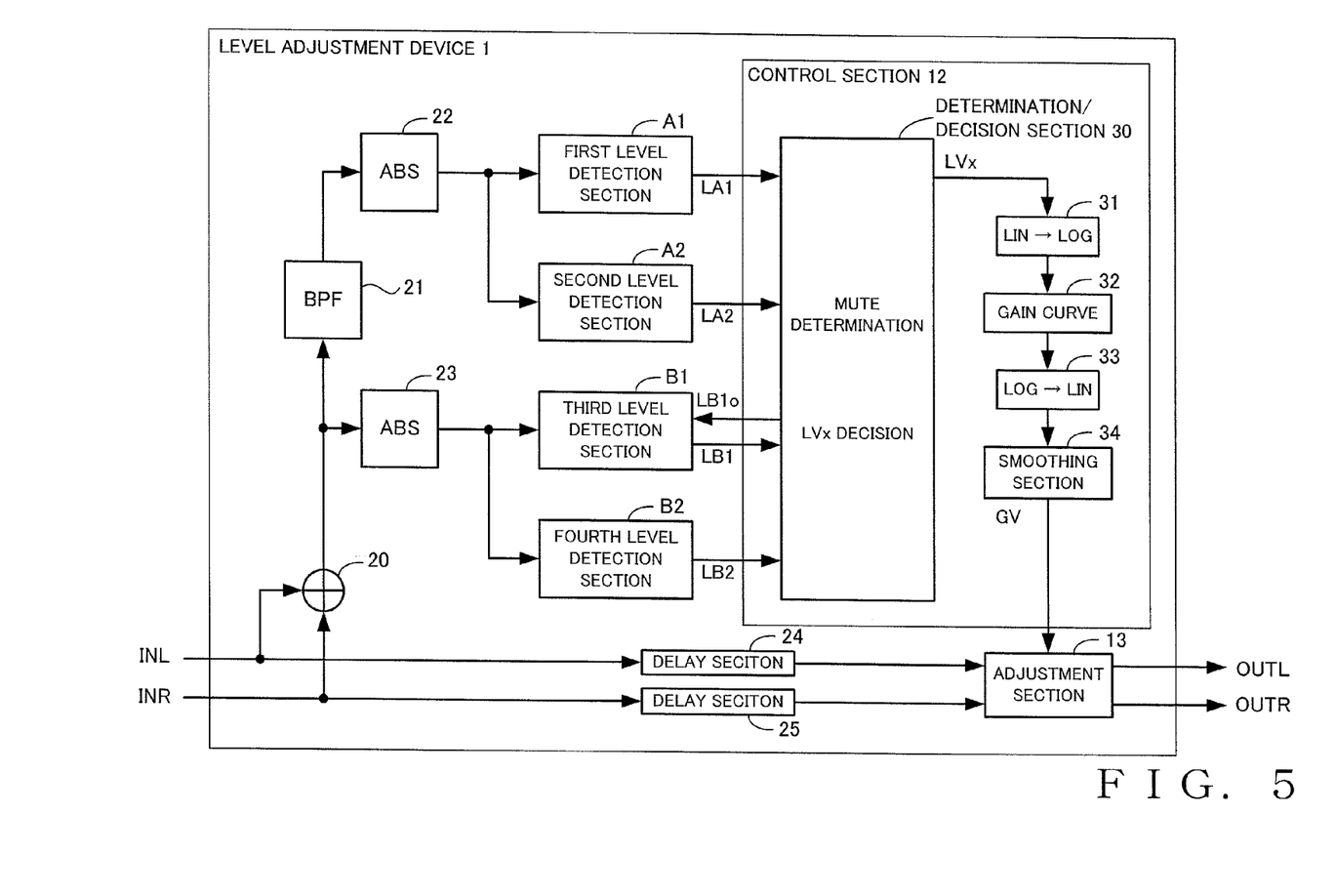
FIG. 5 is a block diagram showing a configuration of the level adjustment device according to a second embodiment of the present invention.

Next, a block diagram showing a configuration of the level adjustment device 1 according to the second embodiment of the present invention is shown in FIG. 5. In the second embodiment, "attack rate," "release rate" and "attack and release rate" are used as following rates as mentioned below, and each of these rates is a "time constant" defining a speed or rate to follow a rectified signal.

In the level adjustment device 1 shown in FIG. 5, stereo audio signals are input from the sound source 51. A left signal (L) of the stereo audio signals is input via an input terminal INL and a right signal (R) of the stereo audio signals is input via an input terminal INR, and both signals are input respectively to the adjustment section 13 via delay sections 24 and 25. Further, the left signal (L) input via the input terminal INL and the right signal (R) input via the input terminal INR are added by an adder section 20 and an added output thereof is input to a band pass filter (BPF) 21 and an absolute value circuit (ABS) 23. The output of the band pass filter (BPF) 21 is input to an absolute value circuit (ABS) 22. BPF 21 is a band pass filter which extracts a main frequency band, which highly contributes to (or influences on) a human auditory volume (i.e., predetermined audible band such as 200 Hz to 10 kHz, for example), from the input audio signals. The filter is not limited to the band pass filter, and may be any kind of filters as long as which has frequency characteristics based on inverse equal loudness characteristics.

The ABS 22 and 23 are full wave rectifiers respectively, which output absolute values of respective sample values of the input digital audio signal. The audio signal processed by BPF 21 and rectified by ABS 22 is input to a first level detection section A1 and a second level detection section A2. The first level detection section A1 and the second level detection section A2 respectively detect the levels of the input audio signal according to the corresponding following rates which are defined by the corresponding attach and release rates, and output a first level signal LA1 and a second level signal LA2 indicating the detected levels respectively. An output value of each of the first and second level signals LA1, LA2 increases at the corresponding following rate indicated by the corresponding attack rate when a current sample value of the input audio signal is greater than a current value of the corresponding one of the first and second level signals LA1 and LA2, and decreases at the corresponding following rate indicated by the corresponding release rate when a current sample value is smaller than a current value of the corresponding one of the first and second level signals LA1 and LA2. The attack rate for the first level detection section A1 is set so as to represent a time constant corresponding to any one of several milliseconds to several tens of milliseconds for example, and the release rate therefor is set so as to represent a time constant corresponding to any one of several hundreds of milliseconds to several seconds for example. On the other hand, the attack rate for the second level detection section A2 is set so as to represent a time constant corresponding to any one of several hundreds of milliseconds to several seconds for example, and the release rate therefor is set so as to represent a time constant corresponding to any one of several seconds to several tens of seconds for example. With this arrangement, the first level detection section A1 is adapted to detect an envelope of each note in the input audio signal at the relatively-higher following rate and without delaying (i.e., the detected envelope presents a peak level of the input audio signal for each of short time periods). Also, the second level detection section A2 is adapted to detect a global level variation of the input audio signal at the lower following rate which is lower several times to several tens of times than the relatively-higher following rate of the first level detection section A1 (i.e., the detected global level variation presents an effective value for each of long time periods).

The audio signal rectified by the ABS 23 without being processed by the BPF 21 is input to a third level detection section B1 and a fourth level detection section B2. The third level detection section B1 is provided to facilitate that the control section 12 detects a time point when performance sounds included in the audio signal have completely decayed with only residual noise remained, in other words, a time point when muting of the audio signal is allowed to start. For that reason, the third level detection section B1 is constructed as a simple low pass filter (LPF) which uses such a following rate (namely, attack and release rate) that there is no distinction between an attack rate and an release rate and that a time constant represented by the following rate (namely, the attack and release rate) is set to any one of several seconds to several tens seconds. Thereby, the third level detection section B1 is adapted to detect a slow level variation for a long time period corresponding to such a time length of one or more bars of a music score, and output a third level signal LB1 indicating the detected level. Also, the fourth level detection section B2 is a level detector provided to facilitate that the control section 12 immediately detects a time point when a musical performance is started and a performance sound in the audio signal starts to rise up, in other words, a time point when the audio signal should be unmuted, and, for this purpose, the fourth level detection section B2 is configured to output a forth level signal LB2 just same as an absolute value of the input audio signal without a delay for following.

Four level signals LA1, LA2, LA3 and LA4 output from four level detection sections A1, A2, A3 and A4 are input respectively to the control section 12. The control section 12 comprises a determination/decision section 30 which is configured to perform a "mute determination process" for determining whether to set a mute mode to ON or OFF and a "LVx decision process" for deciding a level indicated by a level signal LVx to decide a gain value GV to be provided to the adjustment section 13. If the mute determination process makes a "MUTE-ON" determination which means the mute mode should be set to ON, the determination/decision section 30 decides on zero level ($-\infty$ dB) as the level indicated by the level signal LVx and outputs the level signal LVx indicative of the decided level. Also, If the mute determination process makes a "MUTE-OFF" determination which means the mute mode should be set to OFF, the determination/decision section 30 decides on (or selects) one of the first and second level signals LA1 and LA2 as the level signal LVx based on a relation between the first and second level signals LA1 and LA2 and outputs the level signal LVx indicative of the decided level, i.e., a level of the decided or selected one of the first and second level signals LA1, LA2.

A linear-log conversion section 31 converts the level signal LVx, output from the determination/decision section 30, to a level signal LVx on a decibel scale. The control section 12 applies the level signal LVx on the decibel scale to a gain curve table 32 to obtain a gain value GV on the decibel scale corresponding to the level signal LVx from the gain curve table 32. The gain curve table 32 can be used the same one as shown in FIG. 3A or a curve with another value of Lin1 that is more close to zero level (i.e. $-\infty$ dB). A log-linear conversion section 33 converts the gain value GV on the decibel scale to a gain value GV on a linear scale. A smoothing section 34 performs a smoothing process, which includes low-pass filter processing, interpolation processing, etc., to the gain value GV on the linear scale so as to smooth a change in successive values of the gain value GV without causing the gain value GV to stepwise change when the level signal LVx is switched between the first level signal LA1 and the second level signal LA2, and outputs the smoothed gain value GV to the adjustment section 13. Then, the adjustment section 13 amplifies the stereo audio signals from the sound source 51 by the gain corresponding to the smoothed gain value GV, and outputs the amplified stereo audio signals.

As described above, the attack rate of the first level detection section A1 is the time constant relatively short which can follow even a fast attack, and the delay of the fourth level detection section B2 is set to zero. However, by the time that the muting is canceled and the gain value GV is varied actually in response to the attack of the audio signal, a certain delay resulting from each of blocks (21, 22, 23, A1, A2, B1, B2, 12) inserted in a signal controlling path occurs. Delay sections 24 and 25 is provided to compensate the delay, and constructed to delay the input audio signal for a certain period of time (several tens of milliseconds to a several hundreds of milliseconds) and supply the delayed audio signal to the adjustment section 13. Thereby, it is possible to prevent the cancellation of the muting from delaying and prevent the adjustment based on the gain value GV from delaying at the time of an attack of the audio signal.

The level adjustment device 1 according to the second embodiment of the present invention performs a level control using the gain curve shown in FIG. 3A in the same manner as the first embodiment, thereby, an input-output characteristic same as shown in FIG. 3B is realized by the level adjustment device 1 according to the second embodiment as long as any musical sound is contained in the audio signal. In the level adjustment device 1, when a musical performance contained in the input audio signal is over and the level indicated by the third level signal LB1 output from the third level detection section B1 becomes lower than a level which can be considered as the residual noise, the control section 12 makes the "MUTE-ON" determination, and sets the gain GV to zero level so that the audio signal is muted. Thereafter, when the musical performance contained in the input audio signal resumes and the control section 12 makes the "MUTE-OFF" determination, the muting of the audio signal is canceled so that the level adjustment for equalizing the level of the audio signal is resumed. In this way, according to the second embodiment, not only the level equalization similar to the first embodiment is performed, but also a noise gate function for preventing the residual noise from being output can be achieved by the third level detection section B1, the fourth level detection section B2 and the control section 12.

Figures 6A, 6B:
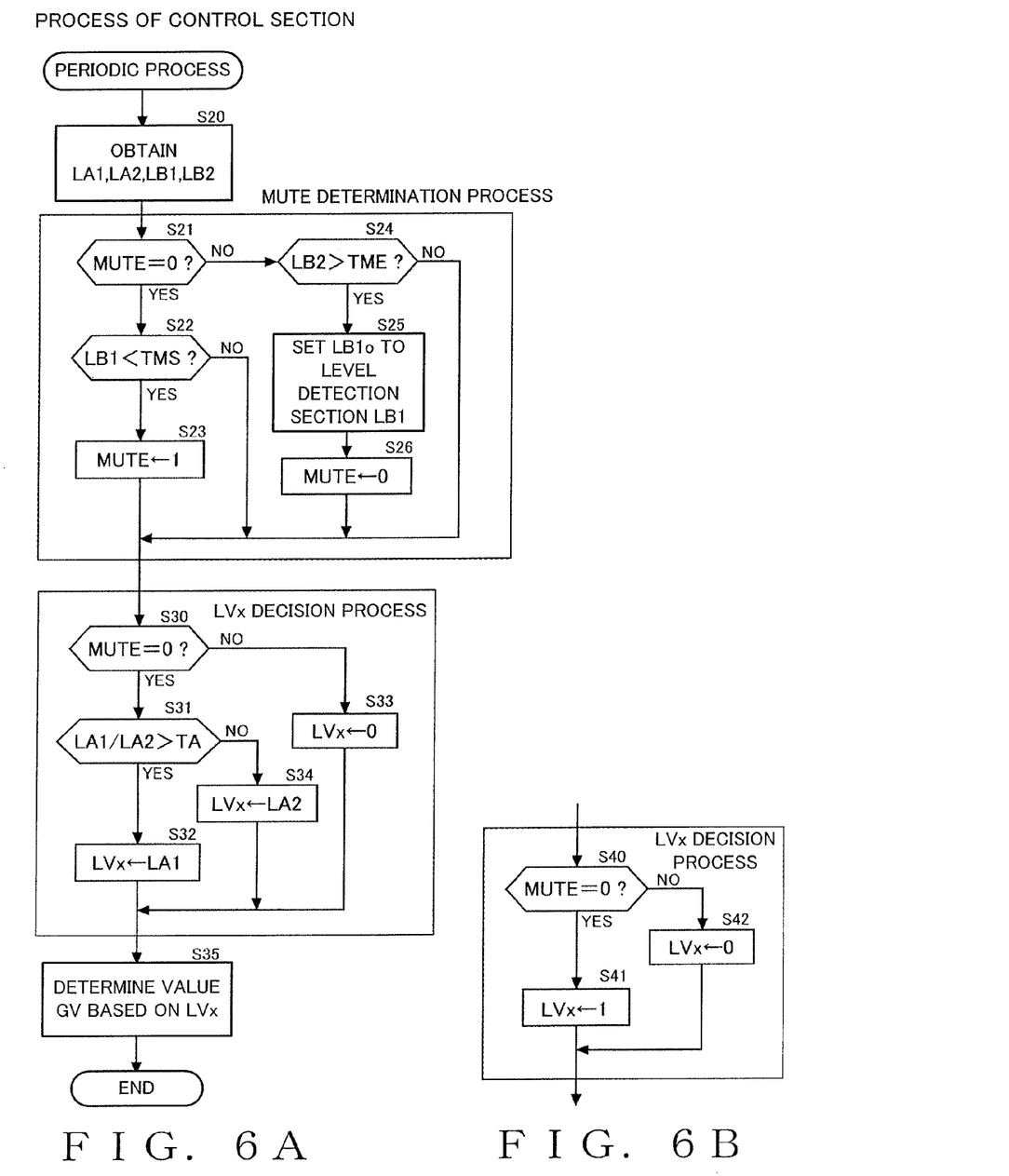
FIGS. 6A and 6B are flow charts of a process executed by a control section of the level adjustment device according to the second embodiment.

FIG. 6A shows a flow chart of a periodic process executing by the control section 12 of the level adjustment device 1 according to the second embodiment. The periodic process shown in FIG. 6A is a process which executes repeatedly during an operating period. The control section 12 executes the periodic process for each predetermined or variable time. First, at step S20, the control section 12 obtains the first to fourth level signals LA1, LA2, LB1 and LB2 from the first to fourth level detection sections A1, A2, B1 and B2. Subsequently to step S20, the control section 12 executes the mute determination process. In the mute determination process, first, at step S21, the control section 12 determines whether the mute mode is currently set to OFF based on a value of a mute register. If the mute mode is set to OFF (affirmative of "MUTE=0"), the control section 12 makes an affirmative judgment at step S21, and advances processing to step S22 to determine whether a current level of the third level signal LB1 is smaller than a threshold value TMS for starting the mute mode. Because the third level detection section B1 detects the level of all frequency bands in the input signal at the rate following the slow level variation for a time duration corresponding to the time length of one or more bars of the music score, if the third level signal LB1 is smaller than the threshold value TMS, it means that the audio signal input to the level adjustment device 1 is the residual noise only (the state that the musical performance is over) and that muting can be started. Thus if the control section 12 makes an affirmative judgment at step S22, the processing is advanced to step S23 to store "1" in the mute register indicating the result of the determination that the mute mode is set to "ON".

On the other hand, if the mute mode is set to ON (namely, "MUTE=1"), the control section 12 makes a negative judgment at step S21, and advances the processing to step S24 to determine whether the fourth level signal LB2 is greater than a threshold value TME for terminating the mute mode. Because the fourth level detection section B2 detects the level of the input signal without delay, if the fourth level signal LB2 is greater than the threshold value TME, it means that a musical sound starts in the audio signal input to the level adjustment device 1 and that the muting can be terminated. Thus, if the control section 12 makes an affirmative judgment at step S24, the processing is advanced to step S25 to set the third level signal LB1 to a initial value LB1o which is a constant corresponding to a level value greater than the threshold value TMS. Thereby, once the control section 12 makes the "MUTE-OFF" determination, at least during a time period when the third level signal LB1 is attenuated from the initial value LB1o to the threshold value TMS in the third level detection section B1, the "MUTE-OFF" determination is maintained. Next, at step S26 the control section 12 stores "0" in the mute register indicating the result of determination that mute mode is set to OFF.

The control section 12 terminates the mute determination process at any time when the step S23 is terminated, when it is determined at the step S22 such that third level signal LB1 is not smaller than the threshold value TMS, when the step S26 is terminated, or when it is determined at the step S24 such that the fourth level signal LB2 is not greater than a threshold value TME, and then starts the LVx decision process.

In the LVx decision process, at step S30, the control section 12 determines whether the "MUTE-OFF" determination has been made (MUTE=0) by the mute determination process having terminated immediately before. If the "MUTE-OFF" determination has been made, the control section 12 makes an affirmative judgment at step S30, and advances the processing to step S31 to determine whether a ratio of the first level signal LA1 to the second level signal LA2 (i.e., a level ratio "LA1/LA2") is greater than a threshold value TA. The threshold value TA is a constant equal to or more than one. If the ratio is greater than the threshold value TA, the control section 12 makes an affirmative judgment at step S31, and advances the processing to step S32 to store the first level signal LA1 in a LVx register. Then, at step S35, the control section 12 determines a gain value GV corresponding to the first level signal LA1 stored in the LVx register based on the gain curve as shown in FIG. 3A. Now, a description will be given about this step in more detail. First, the first level signal LA1 on the linear scale is converted into the first level signal LA1 on the decibel scale (i.e., processing by the linear-log conversion section 31). Next, the first level signal LA1 on the decibel scale is applied to the gain curve on the decibel scale as shown in FIG. 3A, and gets the gain value GV on the decibel scale (i.e., processing by the gain curve table 32). Then, the gain value GV on the decibel scale is converted into the gain value GV on the linear scale (i.e., processing by the log-linear conversion section 33). Further, the smoothing process is applied to the gain value GV on the linear scale (i.e., processing by the smoothing section 34), and the smoothed gain value GV on the linear scale is supplied to the adjustment section 13. With that, the processing of step 35 is completed, and then the control section 12 ends the periodic process.

Then the adjustment section 13 amplifies the input audio signal by a gain corresponding to the smoothed gain value GV and outputs it so that the level adjustment device 1 outputs the audio signal whose level is equalized by the level control at the high following rate. In this case, because the ratio of the first level signal LA1 to the second level signal LA2 is greater than a threshold value TA, the level of the input audio signal increases temporally at a relatively fast speed, and the level adjustment device 1 controls the level of the input audio signal on the basis of the first level signal LA1 obtained by detecting the level of the audio signal at the relatively high following rate. In this way, when the attack of the sound is fast, the level adjustment device 1 temporally performs an equalization of an output level in such a manner as to follow a signal having a fast level variation.

On the other hand, if the ratio (LA1/LA2) of the first level signal LA1 to the second level signal LA2 is equal to or less than the threshold value TA, the control section 12 makes a negative judgment at step S31, and advances the processing to step S34 to store the second level signal LA2 in the LVx register. Then at step S35, similarly to the case of the first level signal LA1 described above, the control section 12 determines a gain value GV corresponding to the second level signal LA2 stored in the LVx register based on the gain curve as shown in FIG. 3A, supplies the smoothed gain value GV to the adjustment section 13, and terminates the periodic process. Then the adjustment section 13 amplifies the input audio signal by the gain corresponding to the gain value GV and outputs it so that the level adjustment device 1 outputs the audio signal whose level is equalized by the level control at the low following rate. In this case, because the level variation of the input audio signal is slow, the level adjustment device 1 controls the level of the audio signal on the basis of the second level signal LA2 obtained by detecting the level of the audio signal by the relatively low following rate. In this way, it is possible to perform the equalization of the output level without making a listener perceive too much a variation of the gain level.

Further, if the "MUTE-ON" determination has been made (MUTE=1), the control section 12 makes a negative judgment at step S30, advances the processing to step S33 to store zero level "0" (−∞ dB) in the LVx register. In addition, by the same processing as the case of the first level signal LA1 described above, the control section 12 determines a gain value GV of zero level (−∞ dB) corresponding to zero level stored in the LVx register based on the gain curve as shown in FIG. 3A, supplies the smoothed gain value GV to the adjustment section 13, and ends the periodic process. In this case, because the adjustment section 13 amplifies the input audio signal by the gain of zero level corresponding to the gain value GV, consequently, the audio signal is muted.

Because the aforementioned periodic process is performed by the control section 12 in the level adjustment device 1 according to the second embodiment of the present invention, it is possible to control the level of the input audio signal without making the listener perceive too much the variation of the gain level, by basically performing the level control on the input audio signal at the slow following rate. Whereas, when the audio signal with a fast attack is input, it is possible to control the level of the input audio signal so as to follow the fast level variation in the signal, by temporally performing the level control on the input audio signal by the fast following rate. Further, when a sound is continuously paused for a while because of an interval between songs for example, it is possible to prevent listeners from hearing the residual noise from speakers 53 by the muting of the audio signal. Because the level adjustment device 1 has a simple construction by merely deciding one gain by applying one gain curve to one detected level, the adjustment of characteristics related to the level control can perform easily or simply, while having useful functions such as described above. Further, the shape of the gain curve can approximate with a shape formed by broken lines because of employing the gain curve on the decibel scale, and thus, the decision of the gain can be realized by a simple arithmetic operation. In addition, it is possible for the gain curve on the decibel scale to expand the controllable range of level (dynamic range) in comparison with a gain curve on a linear scale even if data lengths of the level signals or the gain values are the same.

Note that, in the periodic process according to the second embodiment described above, the control section 12 performs determination processings at steps S22, S24 and S31 on the signals represented on the linear scale, but these determination processings may be performed on signals represented on the decibel scale. If the determination processing at a particular one of the steps S22, S24 and S31 is to be performed on the decibel scale, the linear scale of the level signal related thereto may be converted into the decibel scale at any time from the step 20 until immediately before the particular step. In addition, if the determination processing at step S22 or S24 is to be performed on the decibel scale, a threshold value TMS' or TME' which is obtained by converting the threshold value TMS or TME onto the decibel scale may be used for a determination condition. Further, if the determination processing is to be performed at step S31 on the decibel scale, the determination condition at the step S31 may be changed to a condition in a decibel form, i.e., (LA1−LA2)>TA', where TA' denotes a threshold value which is obtained by converting the threshold value TA onto the decibel scale. The determination condition in the decibel form determines whether a difference between the first and second level signals LA1 and LA2 is greater than the threshold value TA' on the decibel scale, and is actually equivalent to the determination condition in a linear form for determining whether a level ratio of the first level signal LV1 to the second level signal LV2 is greater than the threshold value TA on the linear scale. Further, as for the step S33, by modifying so as to store zero level on the decibel scale (i.e. −∞ dB) in the LVx register at this step S33, the processing for converting from the linear scale to the decibel scale at step S35 (i.e., the linear-log conversion section 31) can be omitted.

Further, in the periodic process according to the second embodiment, the control section 12 applies the gain curve to the level signal LVx even in the case where the "MUTE-ON" determination is made (the negative judgment at the step S30), but the application of the gain curve to the level signal LVx in the "MUTE-ON" mode may be omitted. That is, if the negative judgment is made at step S30, the control section 12 may store directly zero level (−∞ dB) as the gain value GV, and may perform only the processing for smoothing the gain value GV at step S35 to supply the smoothed gain value GV to the adjustment section 13.

Note that the inequality signs in the determination condition at step S22, S24 and S31 may not be limited respectively to the inequality signs "<", ">" and ">", and the inequality signs along with equality signs, namely, "≤", "≥" and "≥", may be used.

Figure 7A:
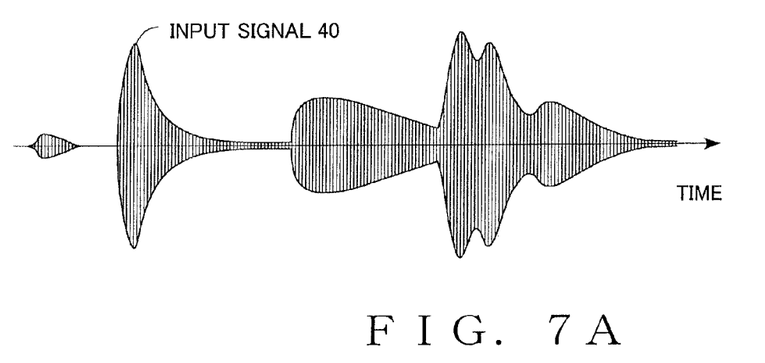
FIGS. 7A and 7B are time charts showing an input signal input to the level adjustment device according to the second embodiment, and a situation in which one of level detection signals detected by a level detection section is selected.
Figure 7B:
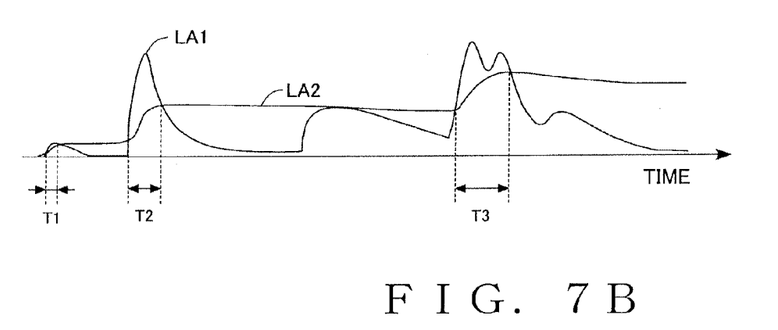

In the level adjustment device 1 according to the second embodiment, as described above, there are a time section where the audio signal from the sound source 51 is equalized based on the first level signal LA1 and a time section where the audio signal from the sound source 51 is equalized based on the second level signal LA2. FIG. 7A shows the audio signal supplied to two level detection sections A1 and A2, and FIG. 7B shows a variation of the level signal LA1 detected by the level detection section A1, a variation of the level signal LA2 detected by the level detection section A2, and time sections T1, T2 and T3 where the level signal LA1 is selected instead of the level signal LA2, wherein horizontal axes are time axes respectively.

The input signal 40 shown in FIG. 7A denotes an outline of waveforms of the audio signal from the sound source 51 having been filtered through BPF 21. FIG. 7B shows the variations of the level signal LA1 and the level signal LA2 detected from the input signal 40. Because the first level detection section A1 detects a peak of levels at the relatively high following rate, the first level signal LA1 can be a level signal which almost follows the envelope of the input signal 40 as shown in FIGS. 7A and 7B. In contrast, because the second level detection section A2 detects the level of the audio signal at the following rate which follows the slow level variation in the audio signal, the level signal LA2 can be a level signal which changes slowly behind the variation of the envelope. During the particular time sections T1, T2 and T3 on the time axis, the ratio or difference between the first and second level signals LA1 and LA2 is greater than the predetermined threshold value of the ratio or difference on the linear or decibel scale. In these time sections, because the control section 12 makes the affirmative judgment at the step S31 to temporally select the first level signal LA1 as the level signal to be stored in the LVx register, the adjustment section 13 can perform the level control on the audio signal without being behind the attack of the input signal 40. During other (normal) time sections than the time sections T1, T2 and T3, because the control section 12 makes the negative judgment at the step S31 to select the second level signal LA2 as the level signal to be stored in the LVx register, the adjustment section 13 can perform the level control on the audio signal without making a listener perceive a variation of the gain Because the value of the second level signal LA2 is not influenced by other level signals, a continuity of gain perceived by the listener is maintained.

Next, the level adjustment device 1 according to the second embodiment can be operated as a simple noise gate by changing the LVx decision process in the periodic process shown in FIG. 6A to another LVx decision process as shown in FIG. 6B. In this case, data to be obtained at the step S20 may be the third level signal LB1 and the fourth level signal LB2 only. If a "MUTE-OFF" determination is made at step S40 (affirmative of "MUTE=0"), the control section 12 stores "1" indicating a reference level (0 dB) in the LVx register at step S41, and sets the gain value GV to the reference level (0 dB) at step S35 accordingly. If a "MUTE-ON" determination is made at step S40 (negative of "MUTE=0"), the control section 12 stores "0" indicating zero level (−∞ dB) in the LVx register at step S42, and sets the gain value GV to zero level (−∞ dB) at step S35 accordingly.

Further, in the aforementioned description, the term "fast level variation" means that the ratio or the difference between the first level signal which is output from the first level detection and follows sharply the level variation of the input signal section and the second level signal which is output from the first second detection section and follows slowly the level variation of the input signal is in such a state that the level of the first level signal is greater than the level of the second level signal Such the state corresponds to a situation where the level of the input signal exponentially increases like the time when a sound in the audio signal is started before silence state, or when a explosive sound, a blast sound or the like occurs in the audio signal, for example.

The level adjustment device 1 according to the aforementioned embodiments controls, in response to the audio signal from the sound source 51, the gain using the level signal of the second level detection section having the low following rate and not distinguishing the level variation during the normal time sections where the level variation is not so fast like a middle of a music piece, and controls the gain using the level signal of the first level detection section capable of addressing the fast level variation during the partial time sections (such as the particular time sections T1,T2,T3 described above) where the level rises up drastically like a beginning of a loud sound, for example. Because the level adjustment device 1 performs the both gain controls based on the same gain curve characteristics, the construction of the level adjustment device 1 is simple, and the level variation characteristics can be controlled easily.

Note that, although the level adjustment device 1 according to the aforementioned embodiments of the present invention is constructed to select any one of output of two level detection sections having different following rate, the level adjustment device 1 is not limited to such a construction and may be constructed to provide three or more level detection sections having different following rate from each other, select any one output of these level detection sections and determine the gain based on the selected output.

Further, in the aforementioned embodiment, the level adjustment device 1 is constructed to select the first level signal if the ratio of the first level signal to the second level signal is equal to or more than the predetermined threshold value which is equal to or more than 1, and otherwise select the second signal. However, it is not limited to do so, and the level adjustment device 1 may be constructed to select the first level signal if a difference between the first level signal and the second level signal is equal to or more than a predetermined threshold value which is equal to or more than 1, and otherwise select the second signal otherwise, for example.

Moreover, the level adjustment device 1 according to the instant embodiments of the present invention may be arranged and implemented using a personal computer (PC) or a digital signal processing processor (DSP) being programmable signal processing thereof, as well as an analog computing circuit.

This application is based on, and claims priority to, JP PA 2014-051426 filed on 14 Mar. 2014. The disclosure of the priority application, in its entirety, including the drawings, claims, and the specification thereof, are incorporated herein by reference.

What is claimed is:

1. A level adjustment device comprising:
a first level detection section configured to detect a first level of an input audio signal according to a first following rate and output a first level signal indicating the detected first level;
a second level detection section configured to detect a second level of the input audio signal according to a second following rate that is lower than the first following rate and output a second level signal indicating the detected second level;
a control section configured to select one of the first level signal or the second level signal based on a relation between the first level signal and the second level signal and determine a gain for adjusting a level of the input audio signal based on only the selected one of the first or second level signal; and
an adjustment section configured to adjust the level of the input audio signal according to the gain determined by the control section.

2. The level adjustment device as claimed in claim 1, wherein the control section is configured to select the first level signal when a ratio of the first level signal to the second level signal is equal to or greater than a predetermined threshold value that is at least one, and to otherwise select the second level signal.

3. The level adjustment device as claimed in claim 1, wherein the control section is configured to:
determine the gain for adjusting the level of the input audio signal to equalize the level of the input audio signal; and
vary the gain slowly, except when the level of the input audio signal increases rapidly.

4. The level adjustment device as claimed in claim 1, wherein the control section is further configured to smooth a change in successive values of the determined gain to prevent a stepwise change when the selected one of the first or second level signal changes between the first level signal and the second level signal.

5. The level adjustment device as claimed in claim 1, further comprising:
a filter configured to extract frequency components of a predetermined audible band from the input audio signal,
wherein the first level detection section and the second level detection section are configured to respectively detect the first level and the second level of the input audio signal processed by the filter.

6. The level adjustment device as claimed in claim 5, wherein the control section is further configured to determine whether the level of the input audio signal, which is not processed by the filter, is smaller than a predetermined threshold value, and instruct the adjustment section to mute the input audio signal in response to the determination of the level of the input audio signal.

7. The level adjustment device as claimed in claim 6, wherein the control section is further configured to instruct the adjustment section to terminate the muting when the control section detects that the level of the input audio signal becomes greater than the predetermined threshold value.

8. The level adjustment device as claimed in claim 1, wherein the control section is configured to determine the gain further based on a gain curve.

9. The level adjustment device as claimed in claim 1, further comprising:
a delay section configured to delay the input audio signal for a certain period of time,
wherein the adjustment section is configured to adjust the level of the input audio signal delayed by the delay section.

10. A computer-implemented method of adjusting a level of an input audio signal, the comprising the steps of:
detecting a first level of the input audio signal according to a first following rate and outputting a first level signal indicating the detected first level;
detecting a second level of the input audio signal according to a second following rate that is lower than the first following rate and outputting a second level signal indicating the detected second level;
selecting one of the first level signal or the second level signal based on a relation between the first level signal and the second level signal, and determining a gain for adjusting the level of the input audio signal based on only the selected one of the first or second level signal; and
adjusting the level of the input audio signal according to the determined gain.

11. A non-transitory computer-readable storage medium containing a group of instructions executable by a processor to implement a method of adjusting a level of an input audio signal, the method comprising the steps of:
detecting a first level of the input audio signal according to a first following rate and outputting a first level signal indicating the detected first level;
detecting a second level of the input audio signal according to a second following rate that is lower than the first following rate and outputting a second level signal indicating the detected second level;
selecting one of the first level signal or the second level signal based on a relation between the first level signal and the second level signal, and determining a gain for adjusting the level of the input audio signal based on only the selected one of the first or second level signal; and
adjusting the level of the input audio signal according to the determined gain.

* * * * *